(12) United States Patent
Suzuki et al.

(10) Patent No.: US 6,806,510 B2
(45) Date of Patent: Oct. 19, 2004

(54) SEMICONDUCTOR DEVICE WITH SURGE PROTECTIVE COMPONENT AND METHOD OF MANUFACTURING THE SEMICONDUCTOR DEVICE

(75) Inventors: Minoru Suzuki, Saitama (JP); Susumu Yoshida, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 10/014,407

(22) Filed: Dec. 14, 2001

(65) Prior Publication Data

US 2002/0074562 A1 Jun. 20, 2002

(30) Foreign Application Priority Data

Dec. 15, 2000 (JP) ........................................ 2000-382184

(51) Int. Cl.[7] ........................ H01L 29/74; H01L 31/111
(52) U.S. Cl. ....................... 257/173; 257/107; 257/109; 257/119; 257/122; 438/48; 438/54; 438/134
(58) Field of Search ............................... 257/173, 130, 257/112, 119, 155, 603, 914, 152, 154, 166, 168, 107, 109, 122; 438/170, 189, 309, 338, 48, 54, 134

(56) References Cited

U.S. PATENT DOCUMENTS

| | | | |
|---|---|---|---|
| 3,628,107 A | | 12/1971 | Kennedy .................... 317/235 |
| 3,772,577 A | * | 11/1973 | Planey ........................ 317/235 |
| 4,223,328 A | * | 9/1980 | Terasawa et al. ............ 257/136 |
| 4,292,646 A | * | 9/1981 | Assour et al. ............... 257/129 |
| 4,484,214 A | * | 11/1984 | Misawa et al. .............. 257/147 |
| 4,800,420 A | * | 1/1989 | Chen et al. .................. 257/774 |
| 4,825,266 A | * | 4/1989 | Whight ........................ 257/605 |
| 4,967,256 A | | 10/1990 | Pathak et al. |
| 5,281,832 A | * | 1/1994 | Clark et al. .................. 257/109 |
| 5,343,065 A | * | 8/1994 | Saitou ......................... 257/355 |
| 5,352,905 A | * | 10/1994 | Ohta ............................. 257/38 |
| 5,371,385 A | * | 12/1994 | Hayashi et al. ............. 257/173 |
| 5,376,809 A | * | 12/1994 | Hayashi et al. ............. 257/173 |
| 5,479,031 A | * | 12/1995 | Webb et al. ................. 257/173 |
| 5,486,709 A | * | 1/1996 | Hayashi et al. ............. 257/110 |
| 5,516,705 A | * | 5/1996 | Webb et al. ................. 438/133 |
| 5,905,282 A | * | 5/1999 | Sato et al. ................... 257/328 |
| 5,962,878 A | * | 10/1999 | Takizawa .................... 257/173 |
| 5,969,922 A | * | 10/1999 | Pezzani ........................ 361/56 |
| 6,448,589 B1 | * | 9/2002 | Casey et al. ................. 257/173 |
| 6,531,717 B1 | * | 3/2003 | Casey et al. ................. 257/109 |
| 2001/0005024 A1 | * | 6/2001 | Bauer et al. ................. 257/109 |

FOREIGN PATENT DOCUMENTS

EP          0 021 899          1/1981

OTHER PUBLICATIONS

European Search Report dated Feb. 3, 2004.

* cited by examiner

*Primary Examiner*—Amir Zarabian
*Assistant Examiner*—Ida M. Soward
(74) *Attorney, Agent, or Firm*—Armstrong, Kratz, Quintos, Hanson & Brooks, LLP.

(57) ABSTRACT

In order to provide a reliable surge protective component with a straightforward manufacturing process, first and second buried layers are diffused over the entire inside surfaces of a semiconductor substrate, and first and second base layers are then diffused over the entire inside surfaces of the first and second buried layers. First and second emitter layers are then partially diffused at the inside of the first and second base layers. The peripheries of the first and second emitter layers are then surrounded by first and second moats, the bottoms of which reach the first and second buried layers. A PN junction formed between the first and second base layers and first and second buried layers is then simply a planar junction.

10 Claims, 8 Drawing Sheets

SEMICONDUCTOR DEVICE WITH SURGE PROTECTIVE COMPONENT AND METHOD OF MANUFACTURING THE SEMICONDUCTOR DEVICE

BACKGROUND OF THE INVENTION

1. Field of the Invention

The present invention relates to the technical field of semiconductor devices, and in particular to the structure of surge protective component.

2. Description of Related Art

In the related art, two terminal surge protective components are widely used as semiconductor devices for protecting electronic circuits from surge voltages occurring due to lightening strikes, etc.

Figure 8:
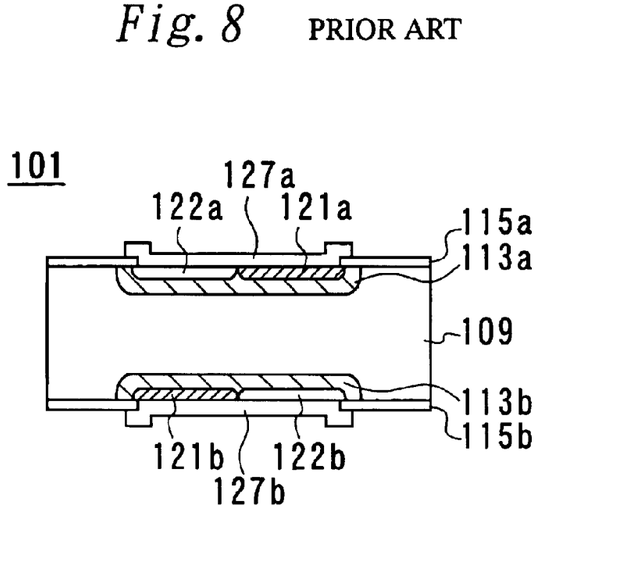
FIG. 8 is a view illustrating a surge protective component of the related art.

Numeral 101 in FIG. 8 is an example of a semiconductor device of the related art. Here, P-type base layers 113a and 113b are provided at a portion in the vicinity of both the inner side surface and the reverse side surface of an N-type substrate 109 so that a PN junction is formed between the substrate 109 and the base layers 113a and 113b.

The base layers 113a and 113b are positioned substantially in the vicinity of the center of the semiconductor device 101, and are patterned so as to be rectangular in shape, with rounded corners. N-type emitters 122a and 122b are arranged at a part in the vicinity of the surface of the inside of the base layers 113a and 113b so that a PN junction is formed between each of the emitter layers 122a and 122b and the base layers 113a and 113b.

Ohmic layers 121a and 121b with a high P-type surface concentration are provided at a portion where the emitter layers 122a and 122b provided in the vicinity of the surface on the inside of the base layers 113a and 113b are not provided.

Metal films 127a and 127b are formed at the surfaces of the emitter layers 122a and 122b and the ohmic layers 121a and 121b on the surface side and rear surface side of the substrate 109. The metal film 127a at the surface side is electrically connected to the surface side emitter layer 122a and the ohmic layer 121a, but is not connected to the substrate 109. The metal film 127b of the rear surface side is electrically connected to the surface side emitter layer 122b and the ohmic layer 121b, but is not connected to the substrate 109.

The semiconductor device 101 of this structure has a four-layer PNPN structure when viewed from the surface side or from the rear side. This means that the PN junction between the base layers 113a and 113b and the substrate 109 is reverse biased for whichever of the metal films 127a and 127b a voltage is applied to, wherein a current flows as a result of this PN junction experiencing an avalanche breakdown.

When a current flows, the PNPN structure latches up, and a voltage state lower than a voltage during avalanche breakdown is maintained between the metal films 127a and 127b. Therefore, when the semiconductor device 101 is connected in parallel with an electronic circuit, when a surge voltage is applied to the electronic circuit, the semiconductor device 101 conducts in such a manner that the surge voltage is not applied to the electronic circuit.

There are, however, drawbacks with this semiconductor device 101 in that the PN junction formed between the base layers 113a and 113b and the substrate 109 are easily destroyed and reliability therefore becomes poor.

In order to improve the reliability of the semiconductor device 101, there has been proposed a structure where a high-concentration N-type layer is provided within the substrate 110 so that a PN junction is formed between the N-type layer and base layers 113a and 113b. However, this requires a complex process because the N-type layer is buried more deeply than the base layers 113a and 113b.

As the present invention sets out to resolve the problems encountered in the related art, it is the object of the present invention to provide a surge protection semiconductor device that has a straightforward manufacturing process, a simple structure, and is highly reliable.

SUMMARY OF THE INVENTION

Figure 6:
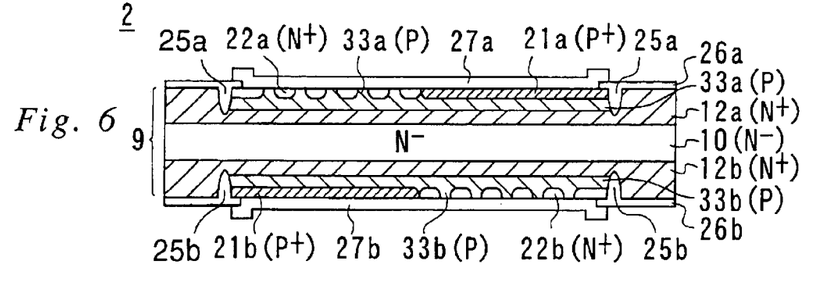
FIG. 6 is a view illustrating a structure for emitter layers of this semiconductor device.

In order to resolve the aforementioned problems, a semiconductor device of the present invention having, when one of either an N-type or P-type is defined as a first conductivity type, and the other is defined as a second conductivity type, a semiconductor substrate of the first conductivity type, comprises first and second buried layers (in this invention, a buried layer may include a layer being partially exposed on the surface of a semiconductor substrate 9 as shown in FIG. 6) provided within the semiconductor substrate, being of the first conductivity type, and being of a higher concentration than the semiconductor substrate, first and second emitter layers of the first conductivity type, first and second base layers of the second conductivity type, and a substrate layer constituted by the semiconductor substrate. The substrate layer is sandwiched between the first and second buried layers. At least a part of the first and second base layers are positioned on one side surface and the other side surface of the semiconductor substrate so as to form PN junctions with the first and second buried layers. At least a part of the first and second emitter layers are located in a vicinity of a surface inside of the first and second base layers so as to form PN junctions with the first and second base layers.

The first and second base layers are respectively provided between the first and second emitter layers and the first and second buried layers, and the first and second buried layers are located between the first and second base layers and the substrate layer.

With this semiconductor device of the present invention, the first and second metal films are formed on both sides of the semiconductor substrate, the first emitter layer and the first base layer are electrically short-circuited by the first metal film; and the second emitter layer and the second base layer are electrically short-circuited by the second metal film.

Further, with the semiconductor device of this invention, ring-shaped first and second moats with bottom surfaces reaching the buried layers are formed on both sides of the semiconductor substrate and the first and second emitter layers are located on inside of the first and second moats.

The insides of the first and second moats of this semiconductor device of the present invention are filled with oxide.

Moreover, at least a part of the first and second base layers are positioned at a region on outside of the first and second moats of surfaces of the semiconductor substrate.

Still further, at least a part of the first and second buried layers are positioned at a region on the outside of the first and second moats of the surfaces of the semiconductor substrate of the semiconductor device of the present invention.

A semiconductor device manufacturing method of the present invention comprises the steps of, when one of an N-type and P-type is defined as a first conductivity type and the other is defined as a second conductivity type:

forming a first buried layer of the first conductivity type in the vicinity of the surface at the inside of one side of the semiconductor substrate of the first conductivity type and forming a second buried layer of the first conductivity type in a vicinity of the surface of the other side, in such a manner that the first and second buried layers sandwich a substrate layer composed of a remaining portion of the semiconductor substrate, forming first and second base layers of the second conductivity type in the vicinity of surfaces at insides of the first and second buried layers in such a manner that bottom surfaces are positioned in the first and second buried layers; and forming first and second emitter layers of the first conductivity type in the vicinity of surfaces at insides of the first and second base layers so that the bottom surfaces thereof are positioned in the first and second base layers.

In the semiconductor device manufacturing method of the present invention, the first and second buried layers are formed by introducing an impurity of the first conductivity type into the semiconductor substrate with the surfaces of both sides of the semiconductor substrate completely exposed and diffusing impurity of the first conductivity type.

Further, in the semiconductor device manufacturing method of the present invention, the first and second base layers are formed by introducing an impurity of the second conductivity type into the first and second buried layers with the surfaces of the first and second buried layers completely exposed and diffusing impurity of the second conductivity type.

Moreover, the semiconductor device manufacturing method of the present invention further comprises a step of, with ring-shaped moats having bottom surfaces reaching positions deeper than the bottom surfaces of the base layers, forming moats including the first and second emitter layers inside of the ring-shaped moats on both sides of the semiconductor substrate.

Further, the semiconductor device manufacturing method of the present invention may comprise a further step of forming first and second metal films short-circuiting the first and second emitter layers positioned inside of the ring-shaped moats and the first and second base layers after filling the insides of the first and second moats with oxide and forming first and second passivation films.

BRIEF DESCRIPTION OF THE DRAWINGS

FIG. 1(a) to FIG. 1(k) illustrate steps for manufacturing a semiconductor device of a first example of the present invention.

FIG. 5(a) to FIG. 5(d) illustrate steps for manufacturing a semiconductor device of a second example of the present invention.

DETAILED DESCRIPTION OF THE PREFERRED EMBODIMENTS

The semiconductor device of the present invention is a two terminal semiconductor device used for protecting electronic circuits from surge voltages. The semiconductor device includes, when one of either an N-type or P-type is defined as a first conductivity type and the other is defined as a second conductivity type, a semiconductor substrate of the first conductivity type, first and second buried layers provided within the semiconductor substrate, being of the first conductivity type, and being of a higher concentration than the semiconductor substrate, first and second emitter layers of the first conductivity type, first and second base layers of the second conductivity type, and a substrate layer constituted by the semiconductor substrate. The semiconductor layer is sandwiched between the first and second buried layers; and the first and second base layers are positioned on one side surface and the other side surface of the semiconductor substrate so as to form PN junctions with the first and second buried layers. The first and second emitter layers are located in the vicinity of the surface of the inside of the first and second base layers so as to form PN junctions with the first and second base layers; and the first and second base layers are respectively provided between the first and second emitter layers and the first and second buried layers, while the first and second buried layers are located between the first and second base layers and the substrate layer.

The first and second buried layers are formed by means of introducing impurities to within the semiconductor substrate with the surface side and rear surface side of the semiconductor being completely exposed. Processing to pattern the first and second buried layers is therefore unnecessary.

The first and second base layers are arranged so as to be positioned in the vicinity of the inside surfaces of the first and second buried layers so that the first and second base layers form PN junctions between the first and second buried layers and a PN junction is not formed between the first and second base layers and the substrate layer.

The first and second base layers are formed in such a manner that the entire surfaces of the first and second buried layers are exposed. When inner portions of first and second moats are then separated from the cross-section of the semiconductor device by the ring-shaped first and second moats with the bottom parts of the first and second base layers reaching the first and second buried layers, there are no spherical or cylindrical junction portions at the PN junction formed between the first and second base layers and the first and second buried layers; and this junction therefore consists only of a planar junction.

Further, when the first and second base layers are formed partially within the first and second buried layers, spherical junction portions and circular junction portions of a PN junction formed between the first and second base layers and the first and second buried layers are eliminated by the first and second moats so that only planar junction portions remain.

In either of these cases, the ends of a PN junction formed between the first and second base layers and the first and second buried layers are exposed within the first and second moats, but are not exposed at the surface of the semiconductor substrate.

The inside of the first and second moats is filled up with oxide etc. and baked so as to form first and second passivation films without causing the electrical characteristics of the PN junction to deteriorate. The oxide may include glass granules comprising lead oxide, aluminum oxide, silicon oxide etc.

A surge protective component of a preferred embodiment of a semiconductor device of the present invention and a method of manufacturing this surge protective component will now be described using the drawings.

FIG. 1(a) to FIG. 1(k) are views showing processes illustrating the method of manufacturing a semiconductor device of a first example of the present invention. Here, the first conductivity type is an N-type (including $N^-$, $N^+$ and $N^{++}$ types) and the second conductivity type is a P-type (including $P^-$, $P^+$ and $P^{++}$-types).

Figure 1A:
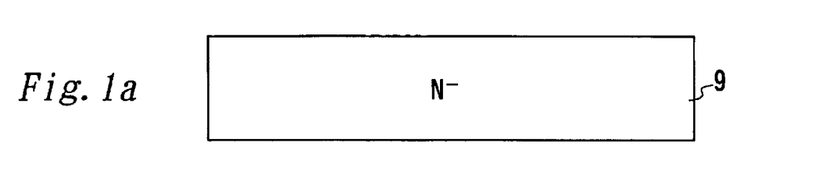

Referring to FIG. 1(a), first, a semiconductor substrate 9 consisting of high-resistivity N-type silicon single crystal is prepared. Here, a crystal with a resistivity of 20 Ωcm or more, and less than or equal to 60 Ωcm (less than or equal to $2\times10^{14}/cm^3$ and greater than or equal to $7\times10^{13}/cm^3$ in concentration conversions) was used as the semiconductor substrate 9.

Figure 1B:
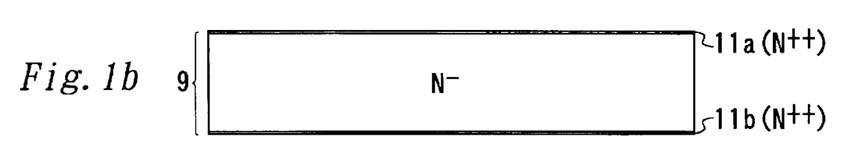

Next, phosphorous is implanted in with the entire surfaces of both sides of the semiconductor substrate 9 exposed; and as shown in FIG. 1(b), high concentration N-type layers 11a and 11b are formed in the vicinity of the surfaces of both of the inner surfaces of the semiconductor substrate 9.

Figure 1C:
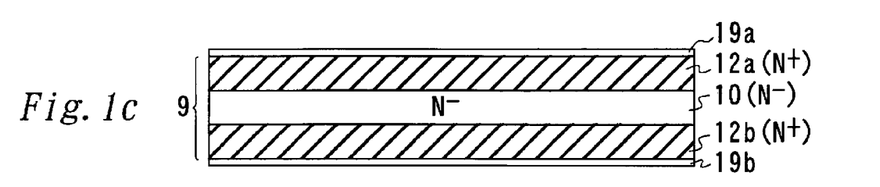

Next, as shown in FIG. 1(c), impurities contained in the high-concentration N-type layers 11a and 11b are diffused through heat processing so that first and second buried layers 12a and 12b of higher surface concentrations than the concentration of the semiconductor substrate 9 are formed. In this state, the surface of the first and second buried layers 12a and 12b coincide with the surface of the semiconductor substrate 9; and the depth of diffusion is substantially equal along the whole of the region for the first and second buried layers 12a and 12b.

Numeral 10 in FIG. 1(c) indicates a substrate layer 10 constituting a low N-type concentration portion, such portion being a portion of the semiconductor substrate 9, except the first and second buried layers 12a and 12b.

In this situation, the first and second buried layers 12a and 12b are formed over both surfaces of the semiconductor substrate 9 in their entireties; and therefore sandwich the substrate layer 10. Numerals 19a and 19b show silicon oxide films formed on the surfaces of the buried layers 12a and 12b during a diffusion process.

Figure 1D:
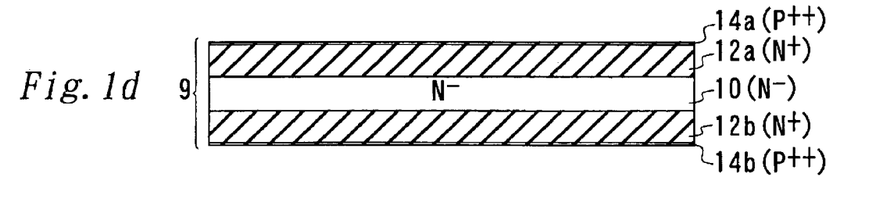

Next, the silicon oxide films 19a and 19b are removed and boron is implated into the vicinity of the surfaces of the inner parts of the first and second buried layers 12a and 12b on the front and rear surfaces with the surfaces of the first and second buried layers 12a and 12b in an exposed state, as shown in FIG. 1(d). High-concentration P-type layers 14a and 14b are formed over the entire surfaces of the first and second buried layers 12a and 12b. In this state, the first and second buried layers 12a and 12b are buried in lower layers of the high-concentration P-type layers 14a and 14b.

Figure 1E:
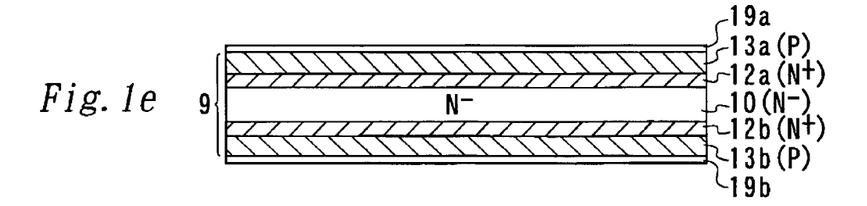
Figure 1F:
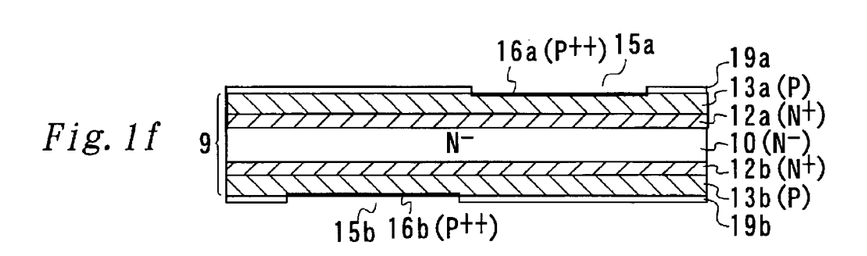

Next, when boron constituting the high-concentration P-type layers 14a and 14b is diffused by subjection to heat processing over a prescribed period of time, P-type first and second base layers 13a and 13b are formed in the vicinity of the inner part of both surfaces of the semiconductor substrate 9, as shown in FIG. 1(f).

As a result of this diffusion processing and diffusion processing described later, the positions of the bottom parts of the first and second base layers 13a and 13b exceed the bottom parts of the first and second buried layers 12a and 12b without being deep; and the first and second base layers 13a and 13b connect with the upper parts of the first and second buried layers 12a and 12b at this bottom part. The first and second base layers 13a and 13b therefore do not connect with the substrate layer 10.

In this state, at the inner part of the semiconductor substrate 9, the first and second buried layers 12a and 12b are positioned on either side of the substrate layer 10; and the first and second base layers 13a and 13b are positioned at the side surfaces of the first and second buried layers 12a and 12b. PN junctions are formed between the first and second base layers 13a and 13b and the first and second buried layers 12a and 12b.

The surface of the first and second base layers 13a and 13b and the surface of the semiconductor substrate 9 coincide; and the first and second buried layers 12a and 12b are not exposed at the surface of the semiconductor substrate 9 because the first and second buried layers 12a and 12b are sandwiched by the first and second base layers 13a and 13b and the substrate layer 10.

Numerals 19a and 19b in FIG. 1(e) show silicon oxide films formed on the surfaces of the base layers 13a and 13b during the diffusion process, and silicon oxide films 19a and 19b are positioned on both sides of the semiconductor substrate 9.

An opening of a large surface area is made at prescribed positions on the silicon oxide films 19a and 19b on the surfaces on both sides of the semiconductor substrate 9 using photographic processes and etching processes. After exposing the surfaces of the base layers 13a and 13b, boron is implanted into this exposed portion and a high-concentration P-type layer is formed. The numerals 15a and 15b in FIG. 1(f) indicate openings of a large surface area formed at the silicon oxide films 19a and 19b. Numerals 16a and 16b indicate high P-type concentration layers formed at the bottom surfaces of the openings 15a and 15b.

Figure 1G:
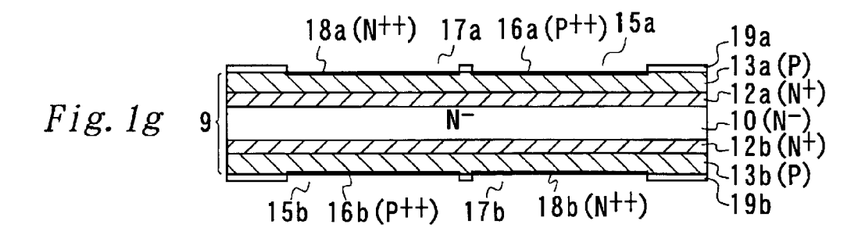

Next, mesh-like openings are made in the planar pattern at positions where the high P-type concentration layers 16a and 16b of the silicon oxide films 19a and 19b on both sides are not formed. The surfaces of the base layers 13a and 13b are then exposed, phosphorous is introduced, and a high N-type concentration layer is formed. Numerals 17a and 17b in FIG. 1(g) indicate mesh-like openings formed respectively at the silicon oxide films 19a and 19b on both sides and numerals 18a and 18b indicate high-concentration N-type layers formed at the bottom surfaces of the openings 17a and 17b. The planar shape of the high N-type concentration layers 18a and 18b is mesh-like.

In this state, high-concentration P-type layers 16a and 16b and high-concentration N-type layers 18a and 18b are both formed in the vicinity of the inner surfaces of the base layers 13a and 13b.

Figure 1H:
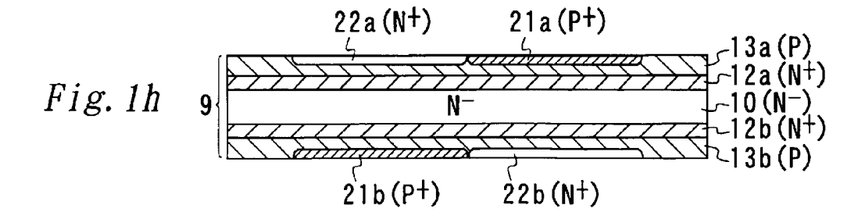

Next, the high-concentration P-type layers 16a and 16b and the high-concentration N-type layers 18a and 18b are diffused by heating. FIG. 1(h) shows the situation after diffusion where the silicon oxide films formed during diffusion processing are removed. Here, first and second ohmic layers 21a and 21b are formed by diffusion of the high P-type concentration layers 16a and 16b; and first and second emitter layers 22a and 22b are formed by diffusion of the high-concentration N-type layers 18a and 18b.

The depth of diffusion of the first and second ohmic layers 21a and 21b and the first and second emitter layers 22a and 22b is shallower than that of the first and second base layers 13a and 13b so that the first and second ohmic layers 21a and 21b and the outer portion of the surface shape of the first and second emitter layers 22a and 22b are located further towards the inside than the outer portion of the surface shape of the first and second base layers 13a and 13b.

The first and second ohmic layers 21a and 21b and the first and second emitter layers 22a and 22b are formed on the insides of the first and second base layers 13a and 13b, respectively.

A PN junction is therefore formed between the first and second emitter layers 22a and 22b and the first and second base layers 13a and 13b because these layers are of opposite conductivity types.

On the other hand, the first and second ohmic layers 21a and 21b and the first and second emitter layers 22a and 22b do not make contact with the first and second buried layers 12a and 12b or with the substrate layer 10.

Figure 4A:
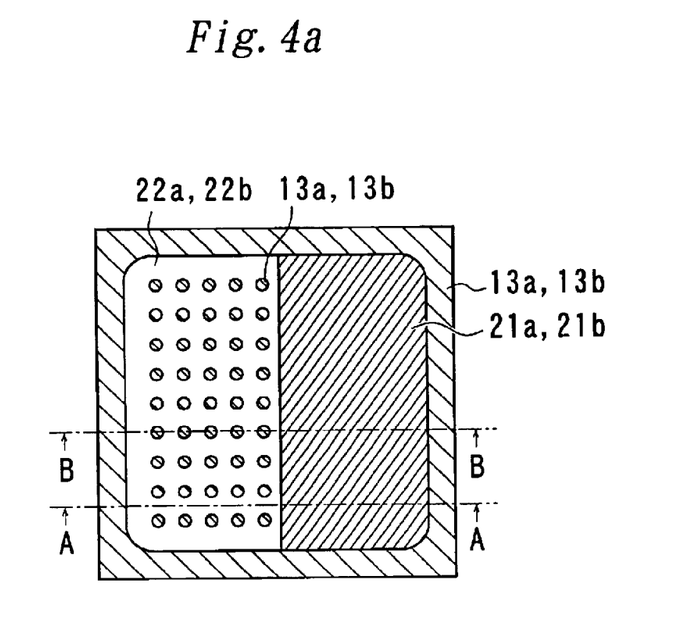
FIG. 4(a) and FIG. 4(b) are views illustrating the planar shape of this semiconductor device.

The pattern on one side of the semiconductor substrate 9 and on the other side is substantially the same in this state. This planar shape is shown in FIG. 4(a). The first and second emitter layers 22a and 22b are formed in the shape of a mesh. This means that the surfaces of the first and second base layers 13a and 13b are exposed in dotted state within the region where the surfaces of the first and second emitter layers 22a and 22b are positioned.

Figure 2:
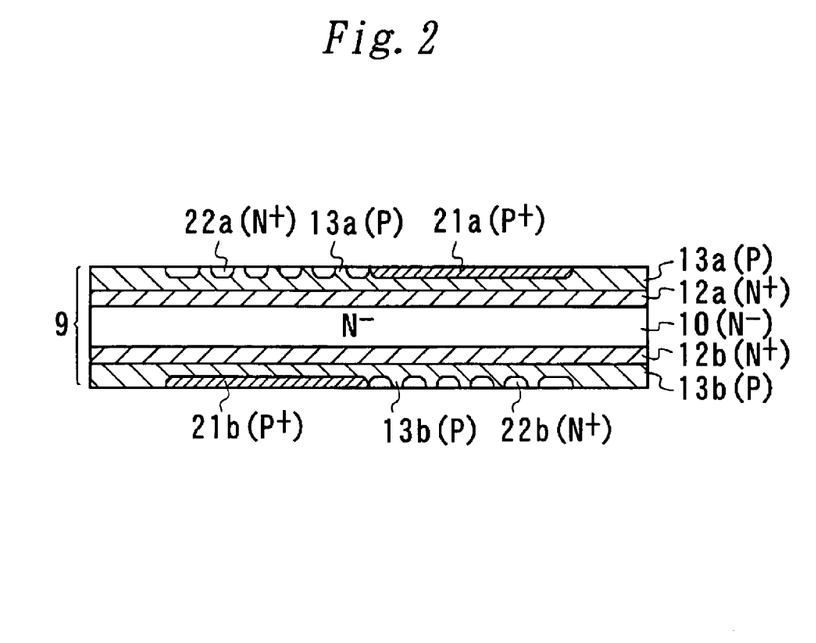
FIG. 2 is a view (first of two) illustrating a structure for emitter layers of this semiconductor device.

FIG. 1(h) is a cross-section of a portion that does not include the first and second base layers 13a and 13b in a dotted state, corresponding to a cross-section taken along line A—A of FIG. 4(a). FIG. 2 is a cross-section of a portion that includes the surfaces of the first and second base layers 13a and 13b in a dotted state that corresponding to a cross-section taken along line B—B of FIG. 4(b).

Next, as shown in the situation in FIG. 1(h) and FIG. 2, resist films having ring-shaped openings are formed on the front and rear surfaces of the semiconductor substrate 9, the semiconductor substrate 9, with the bottom surfaces of the openings exposed, is etched, and moats are formed.

Figure 1I:
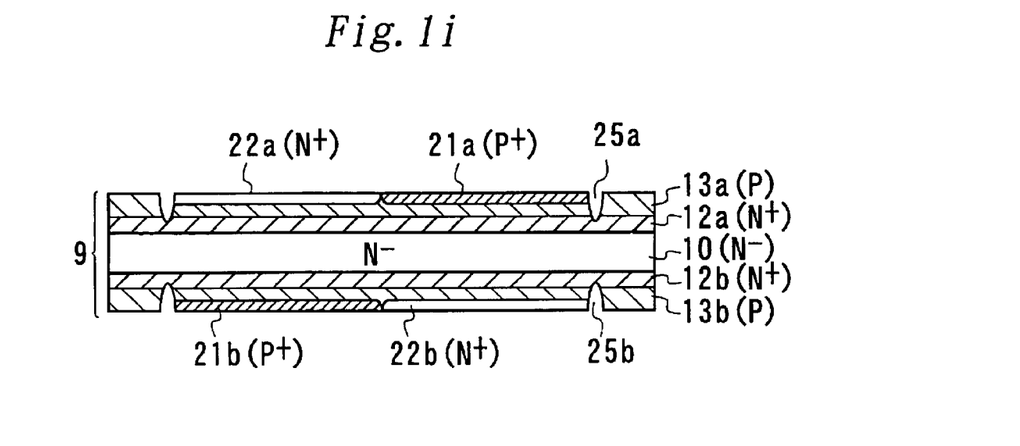

In FIG. 1(i), after moats are formed by etching, the situation is such that the resist film is removed. Here, numeral 25a shows a first moat formed at one side surface of the semiconductor substrate 9 and numeral 25b shows a second moat formed in the surface on the other side.

The ring-shaped openings of the resist films are located along a boundary of the first and second emitter layers 22a and 22b and the first and second base layers 13a and 13b, and the boundary of the first and second ohmic layers 21a and 21b and the first and second base layers 13a and 13b.

In other words, the ring-shaped openings of the resist films are positioned above the edge portions of a region constituted by the first and second ohmic layers 21a and 21b and the first and second emitter layers 22a and 22b. The first and second moats 25a and 25b are formed in the same ring shape as the pattern for the openings for the resist films and are positioned above the edge portions of regions constituted by the first and second ohmic layers 21a and 21b and the first and second emitter layers 22a and 22b. That is, the first and second emitter layers 22a and 22b and the first and second ohmic layers 21a and 21b are positioned to the inside of the rings of the first and second moats 25a and 25b.

The first and second moats 25a and 25b are deeper than the depth of the PN junction formed by the first and second base layers 13a and 13b and the first and second buried layers 12a and 12b; and therefore, the first and second moats 25a and 25b are only dug to depths that do not reach the substrate layer 10. The bottom parts of the first and second moats 25a and 25b are positioned in the first and second buried layers 12a and 12b. Therefore, an inner region and outer region of the first and second moats 25a and 25b of the first and second base layers 13a and 13b are electrically separated by the PN junction formed between the first and second base layers 13a and 13b and the first and second buried layers 12a and 12b.

The PN junction formed between the first and second base layers 13a and 13b on the inside of the first and second moats 25a and 25b and the first and second buried layers 12a and 12b is therefore a planar junction.

Next, oxide is affixed to both sides of the semiconductor substrate 9 and an inside portion of a ring for the first and second moats 25a and 25b (and a scribe line portion for the semiconductor substrate 9 (not shown)) are exposed using photographic and etching processes after baking.

Figure 1J:
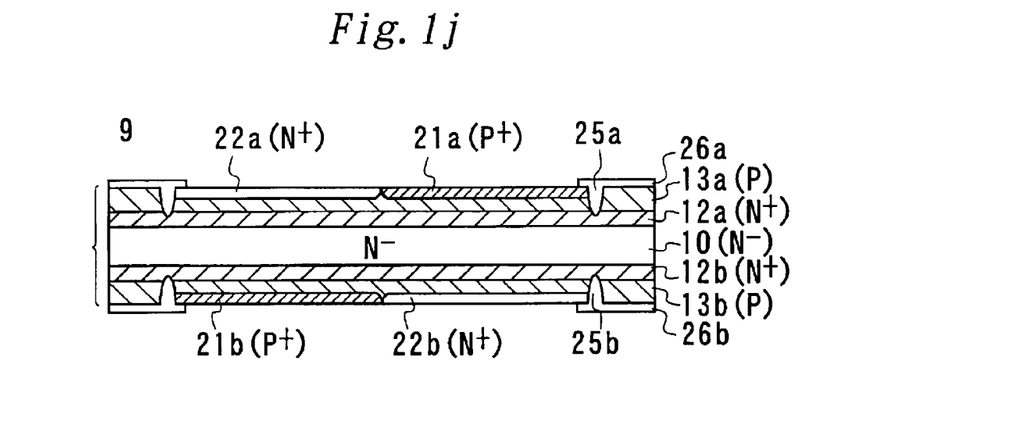

In this state, as shown in FIG. 1(j), first and second passivation films 26a and 26b are formed by silicon oxide that fills up the inside of the first and second moats 25a and 25b and silicon oxide positioned at the surface of the region on the outside of the first and second moats 25a and 25b.

Figure 1K:
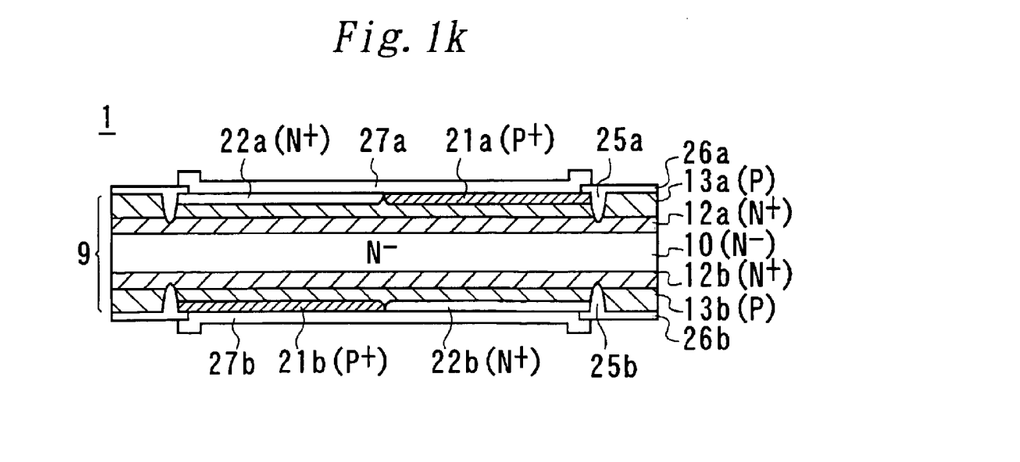

Next, as shown in FIG. 1(k), a first metal film 27a consisting of a metal such as nickel is formed at the surface of the first ohmic layer 21a and first emitter layer 22a on one side of the semiconductor substrate 9. On the other side, a second metal film 27b of the same substance as the first metal film 27 is formed at the surface of the second ohmic layer 21b and the second emitter layer 22b so as to subsequently form the semiconductor device 1 of the present invention.

The surface concentration of the first and second ohmic layers 21a and 21b is higher than the concentration of the surfaces of the first and second base layers 13a and 13b. When the first and second metal films (described later) are formed at the surface of the first and second ohmic layers 21a and 21b and the first and second emitter layers 22a and 22b, the first and second metal films are ohmically connected with the first and second ohmic layers 21a and 21b, and the first and second metal films are therefore electrically connected with the first and second base layers 13a and 13b via the first and second ohmic layers 21a and 21b.

The first and second metal films and the first and second emitter layers 22a and 22b are ohmically connected because the surface concentrations of the first and second emitter layers 22a and 22b are sufficiently high.

The bottom parts of the first and second ohmic layers 21a and 21b and the first and second emitter layers 22a and 22b do not make contact with the first and second buried layers 12a and 12b.

Figure 3:
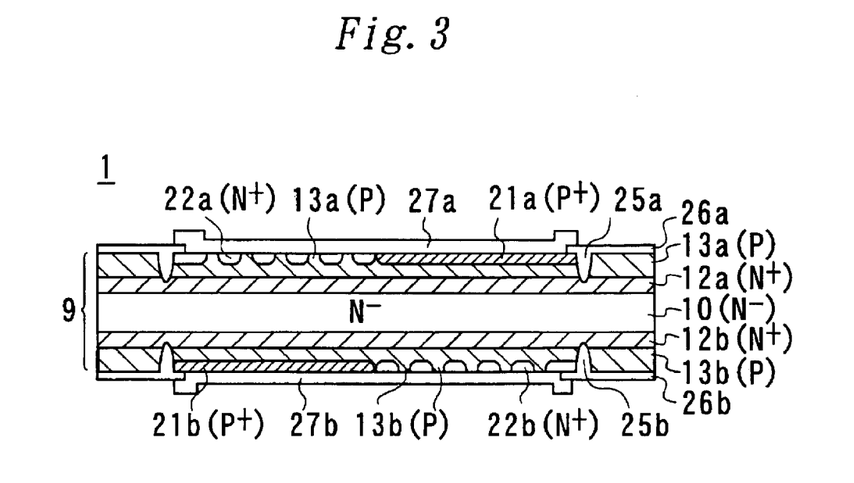
FIG. 3 is a view (second of two) illustrating a structure for emitter layers of this semiconductor device.
Figure 4B:
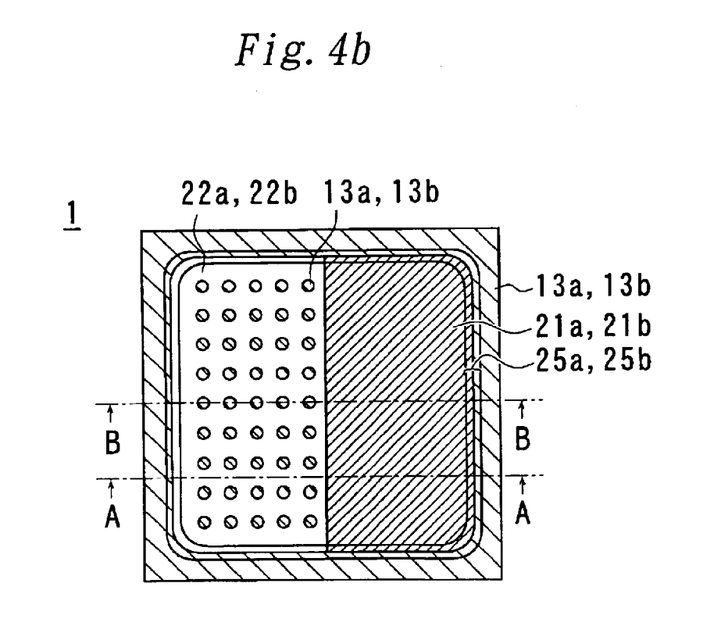

A plan view of the front surface and rear surface in the state, where the first and second passivation films 26a and 26b and the first and second metal films 27a and 27b are peeled, (i.e., in the same state as shown in FIG. 1(i)) is shown in FIG. 4(b). FIG. 3 is a cross-sectional view taken along line B—B in FIG. 4(b).

With the semiconductor device 1 of the present invention, the concentration of the first and second buried layers 12a and 12b is higher than the concentration of the substrate layer 10; and these layers have a resistivity of 4 to 6 Ωcm. The withstand voltage of the PN junction formed between the first and second base layers 13a and 13b; and the first and second buried layers 12a and 12b is therefore low at approximately 200 to 500 Volts.

The depth of the first and second base layers 13a and 13b is approximately 20 to 30 μm and the depth of the first and second buried layers 12 is 30 to 40 μm. The thickness of the substrate layer 10 is approximately 200 to 300 μm.

At the semiconductor device 1, the first and second base layers 13a and 13b and the substrate layer 10 do not make contact; and a PN junction is therefore not formed between them.

A PN junction having a large surface area and low withstand voltage is formed between the first and second base layers 13a and 13b and the first and second buried layers 12a and 12b. Therefore, when a surge voltage is applied so that the semiconductor device 1 conducts, a current flows in the PN junction formed between the first and second base layers 13a and 13b and the first and second buried layers 12a and 12b in a uniform manner without this current partially converging; and resistance to destruction is therefore high.

Further, the PN junction, formed between the first and second base layers 13a and 13b and the first and second buried layers 12a and 12b, is only a planar junction and no spherical junctions or cylindrical junctions exist. There are therefore no portions within the PN junction where the withstand voltage is low and current convergence therefore does not occur.

The first and second buried layers 12a and 12b are formed by diffusion from the surface of the semiconductor substrate 9 and are therefore of a high concentration. The avalanche breakdown voltage of the PN junction between the first and second base layers 13a and 13b and the first and second buried layers 12a and 12b can therefore be easily controlled.

Manufacture can be completed with few photographic processes because the first and second base layers 13a and 13b and the first and second buried layers 12a and 12b are not patterned.

The present invention does, however, also include semiconductor devices where the first and second base layers 13a and 13b are patterned.

The manufacturing processes for this semiconductor device are now described in a second embodiment of a semiconductor device of the present invention, with the diffusion layers and thin films being the same as those for the semiconductor device of the first example and with all items being given the same numerals.

Figure 5A:
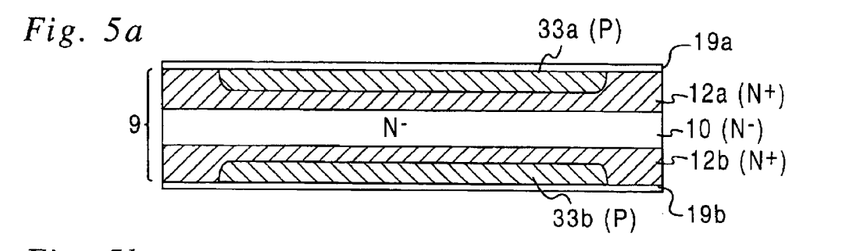

First, FIG. 5(a) is a view corresponding to FIG. 1(e). Referring to FIG. 5(a), points of difference with the above embodiment are that the P-type first and second base layers 33a and 33b are positioned at the centers of the first and second buried layers 12a and 12b and are partially arranged in the vicinity of the surface of the inside thereof. The surfaces of the first and second base layers 33a and 33b and the surfaces of the first and second buried layers 12a and 12b are also exposed at the surfaces of the semiconductor substrate 9.

FIG. 5(a) shows the situation when silicon oxide films 19a and 19b are formed at the surfaces of the first and second base layers 33a and 33b and the surfaces of the first and second buried layers 12a and 12b.

The planar shapes of the first and second base layers 33a and 33b are in the shape of quadrilaterals with rounded corners, with first and second buried layers 12a and 12b remaining at portions at the periphery of the first and second base layers 33a and 33b at the surfaces of the semiconductor substrate 9.

P-type and N-type impurities are implanted into portions in the vicinity of the surface at the inside surfaces of the first and second base layers 33a and 33b are diffused. P⁺type first and second ohmic layers 21a and 21b and N⁺type first and second emitter layers 22a and 22b are then formed, as shown in FIG. 5(b).

Figure 7A:
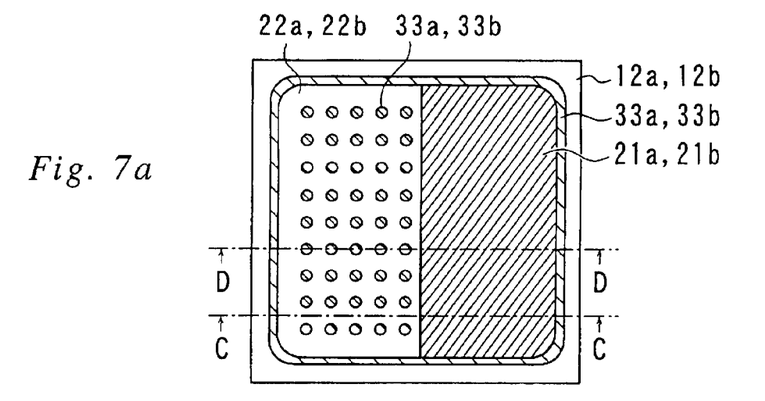
FIG. 7(a) and FIG. 7(b) are views illustrating the planar shape of this semiconductor device.

FIG. 7(a) shows the condition of both sides of the semiconductor substrate 9 in this state. FIG. 5(b) corresponds to a cross-sectional view taken along line C—C of FIG. 7(a).

Figures 5B, 5C:
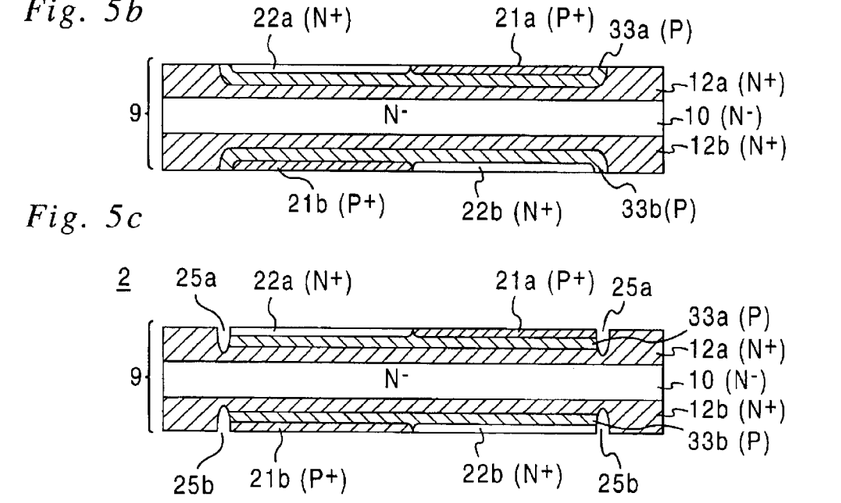

When first and second moats 25a and 25b are formed along exposed edge portions of the surface of the semiconductor substrate 9 of the first and second base layers 33a and 33b (i.e., along portions of the PN junction formed between the first and second base layers 33a and 33b and the first and second buried layers 12a and 12b), exposed at the surface of the semiconductor substrate 9, as shown in FIG. 5(c), the first and second moats 25a and 25b form ring-shapes.

Cylindrical and spherical junction portions of a PN junction formed between the first and second base layers 33a and 33b and the first and second buried layers 12a and 12b by the first and second moats 25a and 25b are removed.

The first and second base layers 33a and 33b are therefore not arranged at the region on the outside of the first and second moats 25a and 25b and portions at the surfaces side of the first and second buried layers 12a and 12b are exposed.

Figure 5D:
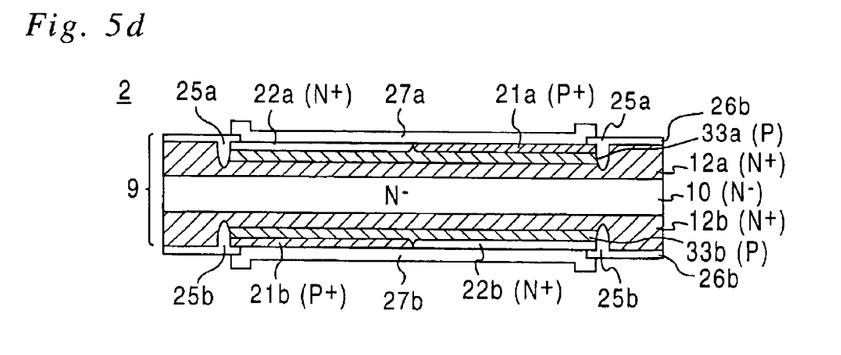

Next, as shown in FIG. 5(d), oxide is baked so as to form first and second passivation films 26a and 26b at a surface portion of the first and second buried layers 12a and 12b, respectively, positioned at regions on the inside of the first and second moats 25a and 25b and on the outside of the first and second moats 25a and 25b.

Next, first and second metal films 27a and 27b are then formed on the inside of the first and second moats 25a and 25b with the surfaces of the first and second ohmic layers 21a and 21b and the first and second emitter layers 22a and 22b exposed in order to obtain a semiconductor device 2 of the present invention.

With this semiconductor device 2, the depths of the first and second moats 25a and 25b are formed to be deeper than the depths of the first and second base layers 33a and 33b and spherical and cylindrical junction portions of the PN junction formed between the first and second base layers 33a and 33b and the first and second buried layers 12a and 12b are removed by the first and second moats 25a and 25b.

The first metal film 27a is electrically connected to the first emitter layer 22a and the first ohmic layer 21a at a surface of one side of the semiconductor substrate 9; and the second metal film 27b is electrically connected to the second emitter layer 22b and the second ohmic layer 21b at a surface on the other side.

Figure 7B:
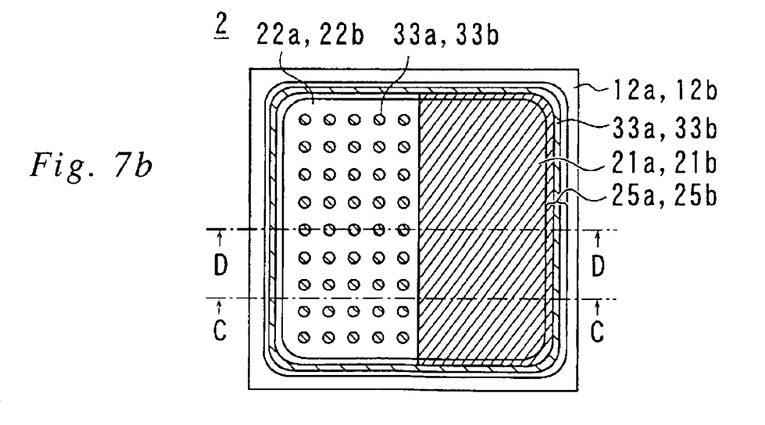

FIG. 7(b) shows surface conditions for the front surface side and the rear surface side of the semiconductor 2 of the present invention with the first and second passivation films 26a and 26b and the first and second metal films 27a and 27b peeled away.

As with the semiconductor device 1 of the first embodiment, the planar shape of the first and second emitter layers 22a and 22b of this semiconductor device 2 is also mesh-shaped; and portions where the first and second base layers 33a and 33b are exposed at the surface of a region where the first and second emitter layers 22a and 22b are located are in dotted state.

FIG. 5(c) is a cross-sectional view taken along a line C—C not passing portions where the first and second base layers 33a and 33b exist. FIG. 6 is a cross-sectional view taken along line D—D passing portions where the first and second base layers 33a and 33b exist.

With the semiconductor device 2 of the second embodiment, the first and second base layers 33a and 33b and the substrate layer 10 also do not make contact and a PN junction is therefore not formed between them. Further, the PN junction formed between the first and second base layers 33a and 33b and the buried layers 12a and 12b is a planar junction and no spherical junctions or cylindrical junctions exist. There are therefore no portions within the PN junction where the withstand voltage is low and current convergence does not occur.

In the above, a description is given where the first conductivity type is taken to be an N-type and the second conductivity type is taken to be a P-type, but conversely, a P-type may be taken to be the first conductivity type and an N-type may be taken to be a second conductivity type. In this case, the semiconductor substrate is P-type, the first and second buried layers are P$^+$-type, the first and second base layers are N-type, the first and second emitter layers are P$^+$-type, and the first and second ohmic layers are N$^+$-type.

A component for protecting against highly destructive surges can be obtained with few photographic processes.

What is claimed is:

1. A semiconductor device manufacturing method comprising, when one of an N-type and P-type is defined as a first conductivity type and the other is defined as a second conductivity type, the steps of:

forming a first buried layer of the first conductivity type in a vicinity of a surface of one side of a semiconductor substrate of the first conductivity type and forming a second buried layer of the first conductivity type in a vicinity of a surface of the other side of the semiconductor substrate, in such a manner that the first and second buried layers sandwich a substrate layer composed of a remaining portion of the semiconductor substrate;

forming first and second base layers of the second conductivity type in a vicinity of surfaces of the first and second buried layers in such a manner that bottom surfaces of said base layers are positioned in the first and second buried layers; and forming first and second emitter layers of the first conductivity type in a vicinity of surfaces of the first and second base layers so that bottom surfaces of said emitter layers are positioned in the first and second base layers, wherein PN junctions formed between the first and second base layers and the first and second buried layers, respectively, are planar junctions.

2. The semiconductor device manufacturing method of claim 1, wherein the first and second buried layers are formed by introducing an impurity of the first conductivity type into the semiconductor substrate with surfaces of both sides of the semiconductor substrate completely exposed and diffusing said impurity of the first conductivity type.

3. The semiconductor device manufacturing method of claim 2, wherein the first and second base layers are formed by introducing an impurity of the second conductivity type into the first and second buried layers with the surfaces of the first and second buried layers completely exposed and diffusing said impurity of the second conductivity type.

4. The semiconductor device manufacturing method of claim 1, further comprising, a step of forming moats including the first and second emitter layers inside of the ring-shaped moats on both sides of the semiconductor substrate, said ring-shaped moats having bottom surfaces reaching positions deeper than bottom surfaces of said base layers.

5. The semiconductor device manufacturing method of claim 4, further comprising a step of forming first and second metal films short-circuiting the first and second emitter layers positioned inside of the ring-shaped moats and the first and second base layers after filling insides of the first and second moats with oxide and forming first and second passivation films.

6. A semiconductor device comprising, when one of either an N-type or P-type is defined as a first conductivity type and the other is defined as a second conductivity type, a semiconductor substrate of the first conductivity type, first and second buried layers of the first conductivity type provided within one side and the other side of the semiconductor substrate respectively, and being of a higher concentration than the semiconductor substrate;

first and second base layers of the second conductivity type provided within a surface of the semiconductor substrate nearer to the surface of the substrate than the first and second buried layers, wherein the first and second buried layers form PN junction to the first and second base layers, respectively;

first and second emitter layers of the first conductivity type, wherein the first and second emitter layers are located in a vicinity of a surface of the first and second base layers so as to form PN junctions with the first and second base layers, respectively, first and second ohmic layers of the second conductivity type and being of a higher concentration than the first and second base layers, wherein the first and second ohmic layers are located in a vicinity of a surface of the first and second base layers, a ring-shaped first moat positioned at an edge portion of regions constituted by the first emitter layer and first ohmic layer, wherein the first moat has a bottom surface deeper than the first base layer and the bottom surface reaches the first buried layer, and a ring-shaped second moat positioned at an edge portion of regions constituted by the second emitter layer and second ohmic layer, wherein the second moat has a bottom surface deeper than the second base layer and the bottom surface reaches the first buried layer, wherein the first and second base layers are exposed at a side surface of the first and second moats so as to form planar PN junctions between the first and second base layers and the first and second emitter layers.

7. The semiconductor device according to claim 6, wherein a first electrode film is provided on the surface of the first emitter layer and the surface of the first base layer so as to short-circuit between the first emitter layer and the first base layer, and a second electrode film is provided on the surface of the second emitter layer and the surface of second base film so as to short-circuit between the second emitter layer and the second base film.

8. The semiconductor device according to claim 6, wherein the insides of the first and second moats are filled with oxide.

9. The semiconductor device according to claim 6, wherein at least a part of the first and second base layers are exposed at a surface of a region located at an outer periphery of the first and second moats.

10. The semiconductor device according to claim 6, wherein at least a part of the first and second buried layers are exposed at a surface of a region located at an outer periphery of the first and second moats.

* * * * *